(12) United States Patent
Park

(10) Patent No.: US 12,055,612 B2
(45) Date of Patent: Aug. 6, 2024

(54) NEGATIVE POISSON'S RATIO MATERIALS FOR ENERGY ABSORPTION

(71) Applicant: Joon Bu Park, Las Vegas, NV (US)

(72) Inventor: Joon Bu Park, Las Vegas, NV (US)

( * ) Notice: Subject to any disclaimer, the term of this patent is extended or adjusted under 35 U.S.C. 154(b) by 0 days.

(21) Appl. No.: 17/742,676

(22) Filed: May 12, 2022

(65) Prior Publication Data

US 2023/0366960 A1    Nov. 16, 2023

(51) Int. Cl.
| | |
|---|---|
| *D21H 27/30* | (2006.01) |
| *D21H 27/32* | (2006.01) |
| *D21H 27/40* | (2006.01) |
| *G01R 33/42* | (2006.01) |
| *H05K 9/00* | (2006.01) |
| *B32B 3/12* | (2006.01) |
| *B32B 29/00* | (2006.01) |
| *B32B 29/08* | (2006.01) |

(52) U.S. Cl.
CPC ............. *G01R 33/42* (2013.01); *D21H 1/02* (2013.01); *D21H 27/32* (2013.01); *D21H 27/40* (2013.01); *H05K 9/0075* (2013.01); *B32B 3/12* (2013.01); *B32B 29/005* (2013.01); *B32B 29/08* (2013.01); *B32B 2250/03* (2013.01); *B32B 2250/26* (2013.01); *B32B 2571/00* (2013.01)

(58) Field of Classification Search
CPC ........ G01R 33/42; D21H 27/32; D21H 27/40; H05K 9/0075; B32B 3/12; B32B 29/005; B32B 29/08; B32B 2250/03; B32B 2250/26; B32B 2571/00
See application file for complete search history.

(56) References Cited

U.S. PATENT DOCUMENTS

| | | | |
|---|---|---|---|
| 4,409,274 A | * | 10/1983 | Chaplin .................... B32B 3/28 428/184 |
| 9,995,359 B2 | | 6/2018 | Martino-Gonzalez et al. |
| 11,117,344 B2 | | 9/2021 | Martino-Gonzalez et al. |

(Continued)

FOREIGN PATENT DOCUMENTS

| | | |
|---|---|---|
| AU | 2018303494 A1 | 3/2020 |
| AU | 3654852 A4 | 6/2020 |

(Continued)

OTHER PUBLICATIONS

[NPL-1] X. Gong et al.; "Zero Poisson's ratio cellular structure for two-dimensional morphing applications"; Composite Structures 134 (2015) pp. 384-392. (Year: 2015).*

(Continued)

*Primary Examiner* — David Sample
*Assistant Examiner* — Donald M Flores, Jr.
(74) *Attorney, Agent, or Firm* — Fish & Richardson P.C.

(57) ABSTRACT

Corrugated paper includes first and second sheets of paper; and a layer of structured paper disposed between the first and second sheets of paper. The layer of structured paper includes cells, in which at least some of the cells are negative Poisson's ratio (NPR) cells. Each NPR cell includes top and bottom walls, and side walls angled inwards toward a central portion of the NPR cell, such that application of a compressive force between the top and bottom walls of the NPR cell causes a lateral dimension of the NPR cell between opposite side walls to decrease. The NPR cells exhibit a Poisson's ratio of between 0 and −1.

7 Claims, 13 Drawing Sheets

(56) References Cited

U.S. PATENT DOCUMENTS

| | | | |
|---|---|---|---|
| 11,267,212 B2* | 3/2022 | Pflug | B29D 24/008 |
| 2007/0286987 A1 | 12/2007 | Anderson et al. | |
| 2008/0185115 A1 | 8/2008 | Morton et al. | |
| 2013/0264757 A1 | 10/2013 | Rajasekaran et al. | |
| 2016/0353825 A1 | 12/2016 | Bottlang et al. | |
| 2017/0129146 A1* | 5/2017 | Zeng | B29C 67/20 |
| 2018/0298560 A1 | 10/2018 | Burazin et al. | |
| 2021/0113213 A1 | 4/2021 | Dahl et al. | |
| 2022/0339892 A1* | 10/2022 | Sun | B29C 33/3835 |

FOREIGN PATENT DOCUMENTS

| | | | |
|---|---|---|---|
| AU | 2020103028 A4 | 12/2020 | |
| BR | PI0404716 A2 | 9/2005 | |
| CN | 105473112 A | 4/2016 | |
| CN | 105965930 B | 7/2018 | |
| CN | 112943834 A | 6/2021 | |
| CN | 112949136 A | 6/2021 | |
| CN | 113650316 | 11/2021 | |
| DE | 102006055828 A1 | 5/2008 | |
| DE | 102008017277 A1 | 10/2009 | |
| DE | 102015014823 A1 | 3/2017 | |
| DE | 602016052689 T2 | 2/2021 | |
| DE | 602018025145 | 10/2021 | |
| EP | 1956139 A1 | 8/2008 | |
| EP | 3043760 A1 | 7/2016 | |
| EP | 3249657 A1 | 11/2017 | |
| EP | 3303871 A4 | 2/2019 | |
| GB | 2420974 B | 1/2007 | |
| IN | 202047001319 A | 1/2020 | |
| KR | 1020170035915 A | 3/2017 | |
| KR | 1020210051428 A | 5/2021 | |
| MX | 2018004047 A | 7/2018 | |
| SE | 540816 C2 | 11/2018 | |
| WO | WO2015038457 A1 | 3/2015 | |
| WO | WO2016195974 A1 | 12/2016 | |
| WO | WO2017202551 A1 | 11/2017 | |
| WO | WO2019017827 A1 | 1/2019 | |

OTHER PUBLICATIONS

Wikipedia.com [online], "Dry Cell", available on or before Apr. 17, 2021, via Internet Archive: Wayback Machine URL <https://web.archive.org/web/20210413103307/https://en.wikipedia.org/wiki/Dry_cell>, retrieved on Sep. 9, 2022, URL<https://en.wikipedia.org/wiki/Dry_cell.>, en.wikipedia.org, Apr. 17, 2021. 4 pages.

International Search Report and Written Opinion in International Appln. No. PCT/US2023/021468, mailed Oct. 23, 2023, 12 pages.

Sparavigna "Paper-based Metamaterials: Honeycomb and Auxetic Structures," International Journal of Sciences, Nov. 2014, 3(11):22-25.

* cited by examiner

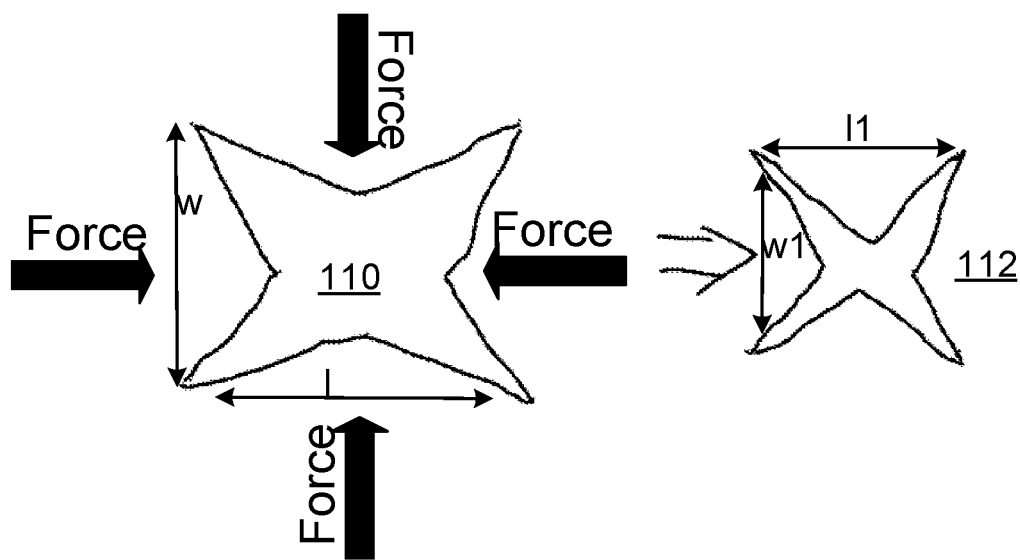
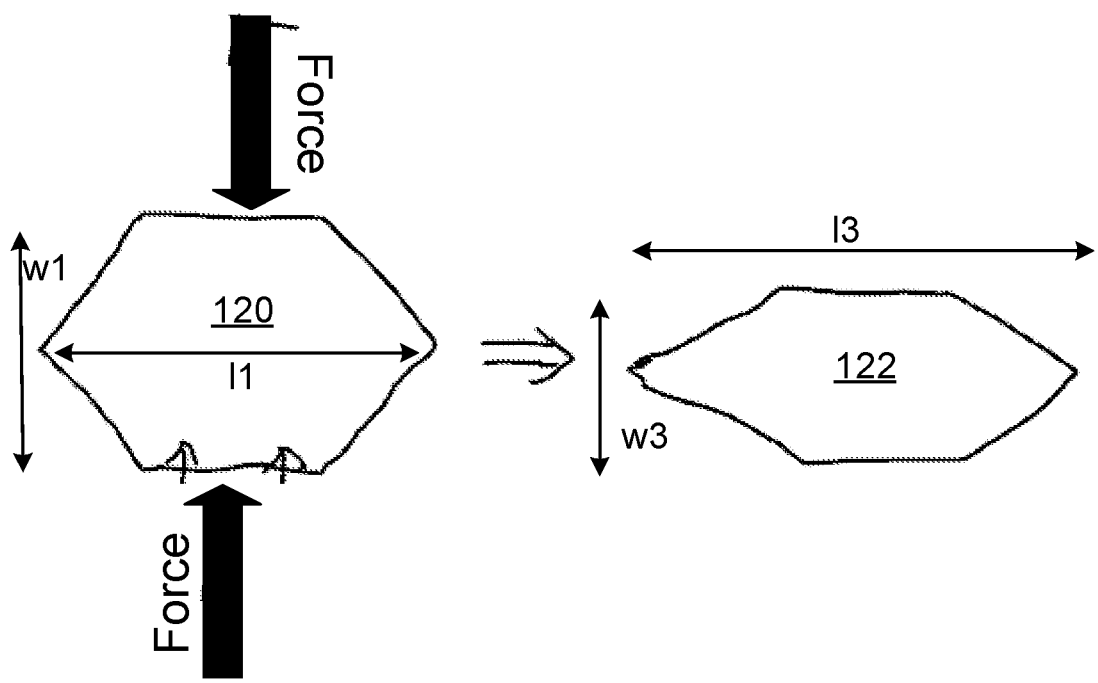
FIG. 1B

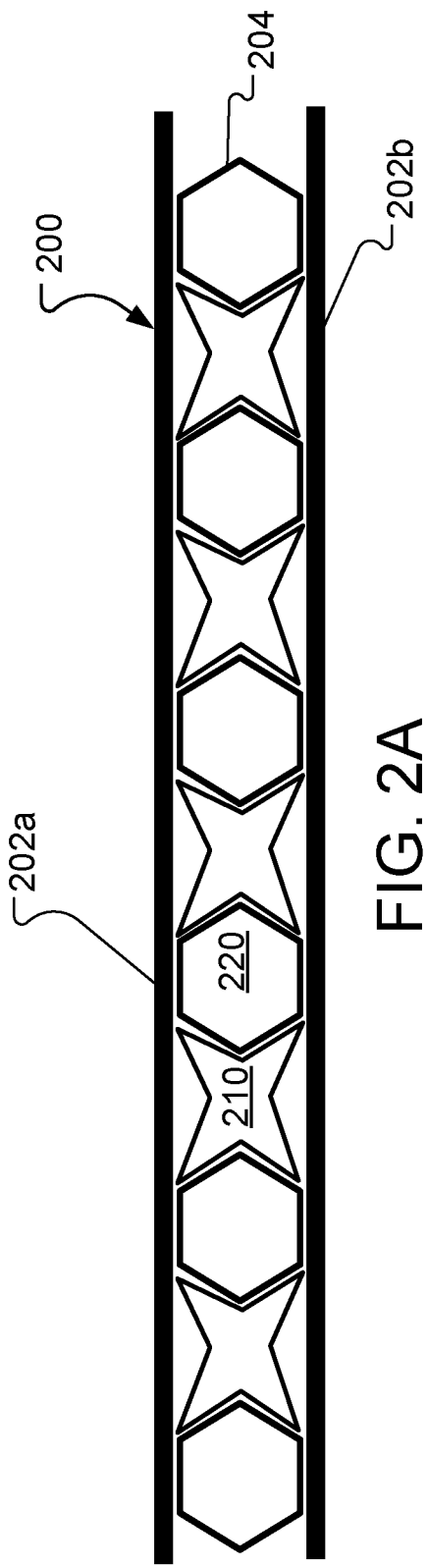
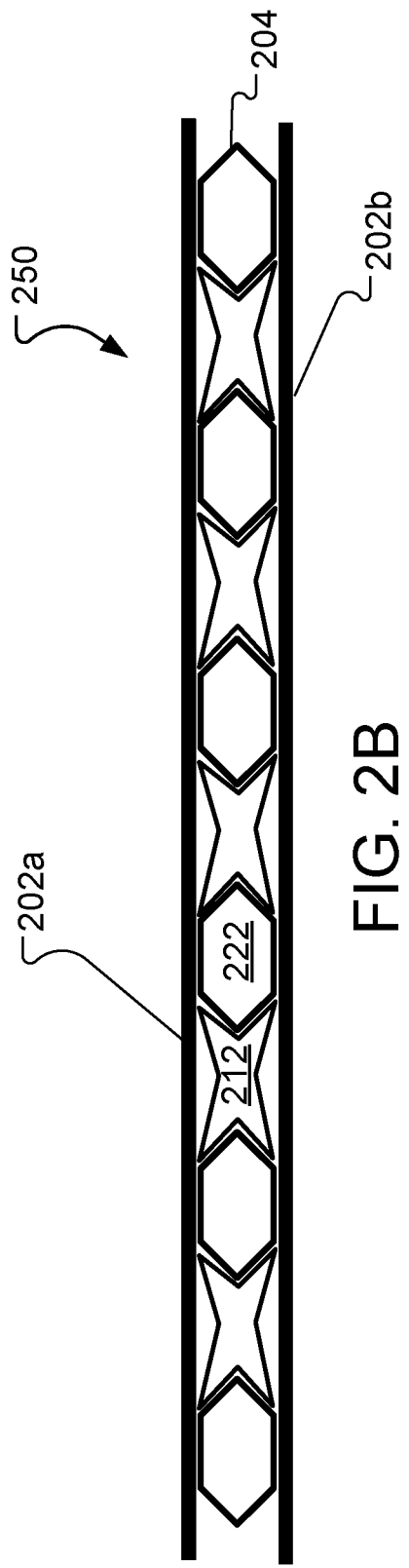

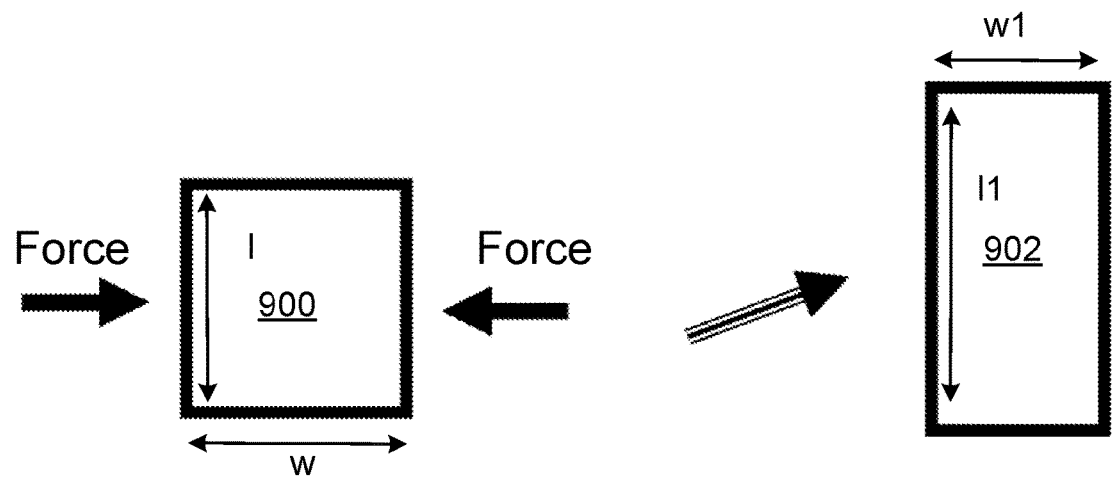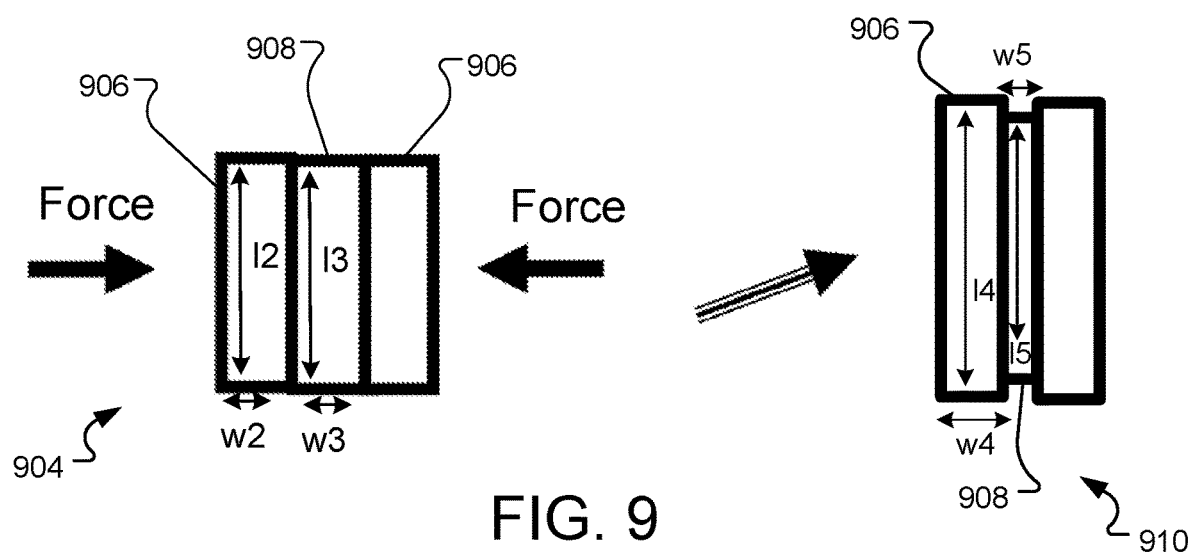
FIG. 9

NEGATIVE POISSON'S RATIO MATERIALS FOR ENERGY ABSORPTION

BACKGROUND

The present disclosure relates generally to materials for energy absorption.

SUMMARY

We describe here materials that exhibit a negative Poisson's ratio ("NPR materials"). NPR materials are durable and capable of attenuating or absorbing energy, such as sound waves, energy from impact, electricity, light, magnetic fields, or energy released from chemical reactions. Corrugated paper that has a structure exhibiting a negative Poisson's ratio can absorb energy from impacts, e.g., protecting internal contents. NPR materials in windows can absorb light energy and energy from impacts. NPR materials in magnetic resonance imaging (MRI) machines can absorb or redirect magnetic fields, and NPR materials can be used in to attenuate or block various types of radiation.

In an aspect, a corrugated paper includes first and second sheets of paper; and a layer of structured paper disposed between the first and second sheets of paper. The layer of structured paper includes cells, in which at least some of the cells are negative Poisson's ratio (NPR) cells. Each NPR cell includes top and bottom walls, and side walls angled inwards toward a central portion of the NPR cell, such that application of a compressive force between the top and bottom walls of the NPR cell causes a lateral dimension of the NPR cell between opposite side walls to decrease. The NPR cells exhibit a Poisson's ratio of between 0 and −1.

Embodiments can include one or any combination of two or more of the following features.

The top, bottom, and side walls of each NPR cell define a hollow interior space at the central portion of the NPR cell.

Each NPR cell is a solid foam cell.

The side walls of each NPR cell include an NPR material, e.g., an NPR foam material.

The side walls of each NPR cell define a concave profile.

At least some of the cells of the layer of structured paper are positive Poisson's ratio (PPR) cells. Each PPR cell includes top and bottom walls, and side walls angled outwards away from a central portion of the PPR cell, such that application of a compressive force between the top and bottom walls of the NPR cell causes a lateral dimension of the PPR cell between opposite side walls to increase. In some cases, the layer of structured paper includes NPR cells alternating with PPR cells, where an angled region of the side wall of a particular PPR cell is nested within an angled region of the side wall of an adjacent NPR cell. In some cases, the side walls of each PPR cell define a convex profile.

In an aspect, a window includes a window frame including an exterior layer defining an exterior surface of the frame, an interior layer defining an interior surface of the frame, and a middle layer disposed between the interior layer and the exterior layer. The middle layer includes a negative Poisson's ratio (NPR) foam material having a Poisson's ratio of between 0 and −1. The window includes a window pane disposed within an interior space defined by the frame.

Embodiments can include one or any combination of two or more of the following features.

The NPR foam material includes an NPR polymer foam, such as an NPR thermoplastic polymer foam, an NPR viscoelastic foam, or an NPR rubber foam.

The NPR foam material has a cellular structure having a characteristic dimension of between 0.1 μm and 3 mm.

The middle layer of the frame includes a composite material including the NPR foam material and a positive Poisson's ratio (PPR) material. In some cases, the middle layer of the frame includes a layered NPR-PPR composite material. In some cases, the middle layer of the frame includes a matrix NPR-PPR composite material.

The window pane includes an NPR material. In some cases, the window pane is transparent to visible light. In some cases, the window pane includes an NPR polymer glass material. In some cases, the window pane includes an NPR-PPR composite material.

In an aspect, a magnetic resonance imaging (MRI) scanner includes a housing defining an interior bore; and a magnetic field generation system disposed in the housing, in which an exterior surface of the housing includes an NPR material.

In an embodiment, the exterior surface of the housing includes an NPR-PPR composite material.

Other embodiments are within the scope of the claims.

DESCRIPTION OF DRAWINGS

FIGS. 1A and 1B are illustrations of corrugated paper.
FIGS. 2A and 2B are illustrates of corrugated paper.
FIG. 9 is an illustration of a material with a positive Poisson's ratio and a composite material.

DETAILED DESCRIPTION

We describe here materials that exhibit a negative Poisson's ratio ("NPR materials"). NPR materials are durable and capable of attenuating or absorbing energy, such as sound waves, energy from impact, electricity, light, magnetic fields, or energy released from chemical reactions. Corrugated paper that has a structure exhibiting a negative Poisson's ratio can absorb energy from impacts, e.g., protecting internal contents. NPR materials in windows can absorb light energy and energy from impacts. NPR materials in magnetic resonance imaging (MRI) machines can absorb or redirect magnetic fields, and NPR materials can be used in to attenuate or block various types of radiation.

Figure 1A:
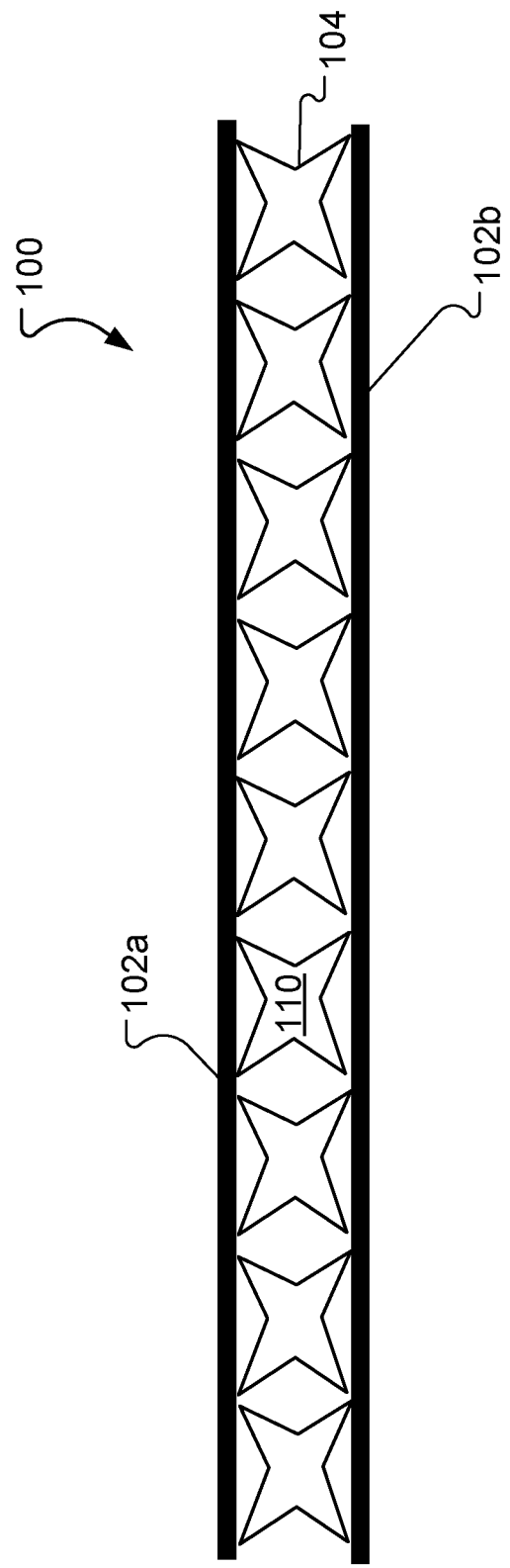

Referring to FIG. 1A, corrugated paper 100 is formed of two substantially parallel sheets of paper (e.g., paper, cardstock, cardboard, or other suitable paper) 102a, 102b and a layer of structured (e.g., fluted) paper 104 disposed between the sheets of paper 102a, 102b (collectively referred to as sheets of paper 102). The structured paper 104 provides strength to the structure of the corrugated paper 100. In some embodiments, the corrugated paper 100 can include more than two sheets of paper 102 and more layers of structured paper 104 (e.g., three sheets of paper 102 and two layers of structured paper 104, with one layer of structured paper 104 disposed between each two adjacent sheets of paper 102).

Corrugated paper can be used to insulate materials from impact. For example, corrugated paper is used in cardboard boxes to protect materials during shipping.

The structured paper 104 has cells 110 that are structured to exhibit a negative Poisson's ratio (NPR). For instance, the cells 110 can be re-entrant cells such that the structured paper 104 is a re-entrant foam, discussed further in the next paragraph. An object with a negative Poisson's ratio is an object that has a Poisson's ratio that is less than zero, such that when the object experiences a positive strain along one axis (e.g., when the object is stretched), the strain in the object along the two perpendicular axes is also positive (e.g., the object expands in cross-section). Conversely, when the object experiences a negative strain along one axis (e.g., when the object is compressed), the strain in the object along a perpendicular axis is also negative (e.g., the object compresses along the perpendicular axis). By contrast, an object with a positive Poisson's ratio (PPR) has a Poisson's ratio that is greater than zero. When an object with a PPR experiences a positive strain along one axis (e.g., when the object is stretched), the strain in the object along the two perpendicular axes is negative (e.g., the object compresses in cross-section), and vice versa.

FIG. 1B illustrates a re-entrant cell 110 of the structured paper 104. A re-entrant cell is a structure in which the walls of the cells are concave, e.g., protruding inwards toward the interior of the cells. In a re-entrant structure, compression applied to opposing walls of a cell will cause the four other, inwardly directed walls of the cell to buckle inward further, causing the material in cross-section to compress, such that a compression occurs in all directions. Similarly, tension applied to opposing walls of a cell will cause the four inwardly directed walls of the cell to unfold, causing the material in cross-section to expand, such that expansion occurs in all directions. NPR foams can have a Poisson's ratio of between −1 and 0, e.g., between −0.8 and 0, e.g., −0.8, −0.7, −0.6, −0.5, −0.4, −0.3, −0.2, or −0.1. NPR foams can have an isotropic Poisson's ratio (e.g., Poisson's ratio is the same in all directions) or an anisotropic Poisson's ratio (e.g., Poisson's ratio when the foam is strained in one direction differs from Poisson's ratio when the foam is strained in a different direction).

The re-entrant cell 110 is a hollow cell that has length l and width w, with side walls that are angled inwards toward a central region of the cell 110 to define a concave profile. In the illustrated example, the top and bottom walls of the cell 110 are flat and generally parallel; in some examples, the top and bottom walls are also angled inwards toward the central region of the cell. When a force is applied the re-entrant cell 110 along the width of the cell 100, the cell deforms into the shape shown as deformed cell 112. Both the width w2 and the length l2 of deformed cell 112 are less than the width w and length l, respectively, of the re-entrant cell 110: the cell compresses along both its width and its length such that the cell exhibits a negative Poisson's ratio. Specifically, the angled region of each side wall of the re-entrant cell 110 collapses inwards, shrinking the lateral dimension of the cell 110. In some examples, the re-entrant cell 110 is a solid foam structure that does not have a hollow center.

By way of explanation, a cell 120 of a foam structure that exhibits a positive Poisson's ratio (PPR) is also shown. The cell 120 has length l1 and width w1, with side walls that are angled outwards away from a central region of the cell 120, defining a convex profile. When a force is applied along the width of the cell 120, the cell deforms into the shape shown as deformed cell 122. The width w3 of deformed cell 122 is less than the width w1 of cell 120, and the length l3 of cell 122 is greater than the length l3 of cell 120: the material compresses along its width and expands along its length such that the cell exhibits a positive Poisson's ratio. Specifically, the angled region of each side wall of the cell 120 collapses outwards, increasing the lateral dimension of the cell 120.

Referring again to FIG. 1A, when a compressive force is applied to the corrugated paper 100, the cells 110 of the structured paper 104 contract in one or both directions perpendicular to the applied force. For instance, when a compressive force is applied to the sheets of paper 102a, 102b, the cells 110 also contract laterally. This NPR behavior helps to maintain structural integrity of the corrugated paper, e.g., preventing the structured paper 104 from squeezing out from the between the sheets of paper. The presence of NPR structure in the corrugated paper also can contribute to target performance characteristics, such as durability and impact resistance.

Although the structured paper 104 of the corrugated paper 100 is shown having a single layer of cells 110, in some examples, the structured paper can have multiple layers of cells. The cells in each layer can be aligned with one another (e.g., with each cell stacked directly on top of a cell of an underlying layer) or can be misaligned. The multiple layers can have cells of the same size, or each layer can have cells of a size different from the size of the cells of one or more of the other layers. The cells within a given layer can be uniformly sized (as illustrated) or can be of different sizes.

In addition to the NPR structure of the structured paper 104, the corrugated paper 100 can include NPR materials. For instance, the sheets 102, the material of the structured paper 104, or both can include an NPR material, such as an NPR foam material, e.g., an NPR paper foam material; or an NPR-PPR composite material. The material of the structured paper 104 including an NPR material means that the walls of the cells 110 themselves include an NPR material.

Referring to FIG. 2, corrugated paper 200 is formed of two substantially parallel sheets of paper, cardstock, or cardboard 202a, 202b and a layer of structured paper 204 disposed between the two sheets of paper 202. In this example, the structured paper 204 is a foam structure that is formed of two types of cells: re-entrant cells 210 that exhibit NPR behavior (referred to as "NPR cells") and cells 220 that exhibit PPR behavior (referred to as "PPR cells"). NPR cells 210 and PPR cells 220 are arranged in alternating fashion. The angled region of the side wall of a given PPR cell 220 is nested within the angled region of the side wall of the adjacent NPR cell 210.

When a compressive force is applied to the corrugated paper 200, the structured paper 204 deforms, forming deformed corrugated paper 250. Responsive to the compressive force, the NPR cells 210 contract in dimension both in the direction of the applied compressive force and in the direction perpendicular to the applied compressive force into deformed cells 212, in which both the length and width are decreased, e.g., the angled regions of the side walls of the NPR cells collapse inwards. The PPR cells 220 contract in the direction of the applied compressive force but expand in the direction perpendicular to the applied compressive force into deformed cells 222, e.g., the angled regions of the side walls of the PPR cells 220 expand outwards. Because the NPR cells and PPR cells alternate in the structured paper 204, the lateral expansion and compression of the two types of cells complement one another such that the structured paper 204 compresses along its thickness while remaining substantially the same width. This structure provides stability and durability to the corrugated paper.

Although the structured paper 204 of the corrugated paper 200 is shown having a single layer of cells 210, 220, in some examples, the structured paper can have multiple layers of cells. The cells in each layer can be aligned with one another (e.g., with each cell stacked directly on top of a cell of an underlying layer) or can be misaligned. The multiple layers can have cells of the same size, or each layer can have cells of a size different from the size of the cells of one or more of the other layers. The cells within a given layer can be uniformly sized (as illustrated) or can be of different sizes.

NPR materials have a lower density than PPR materials, e.g., than PPR materials of a similar composition or than PPR materials having similar mechanical properties, and corrugated papers including NPR materials can thus be lighter in weight and use less material than similar objects formed of PPR materials.

Figure 3A:
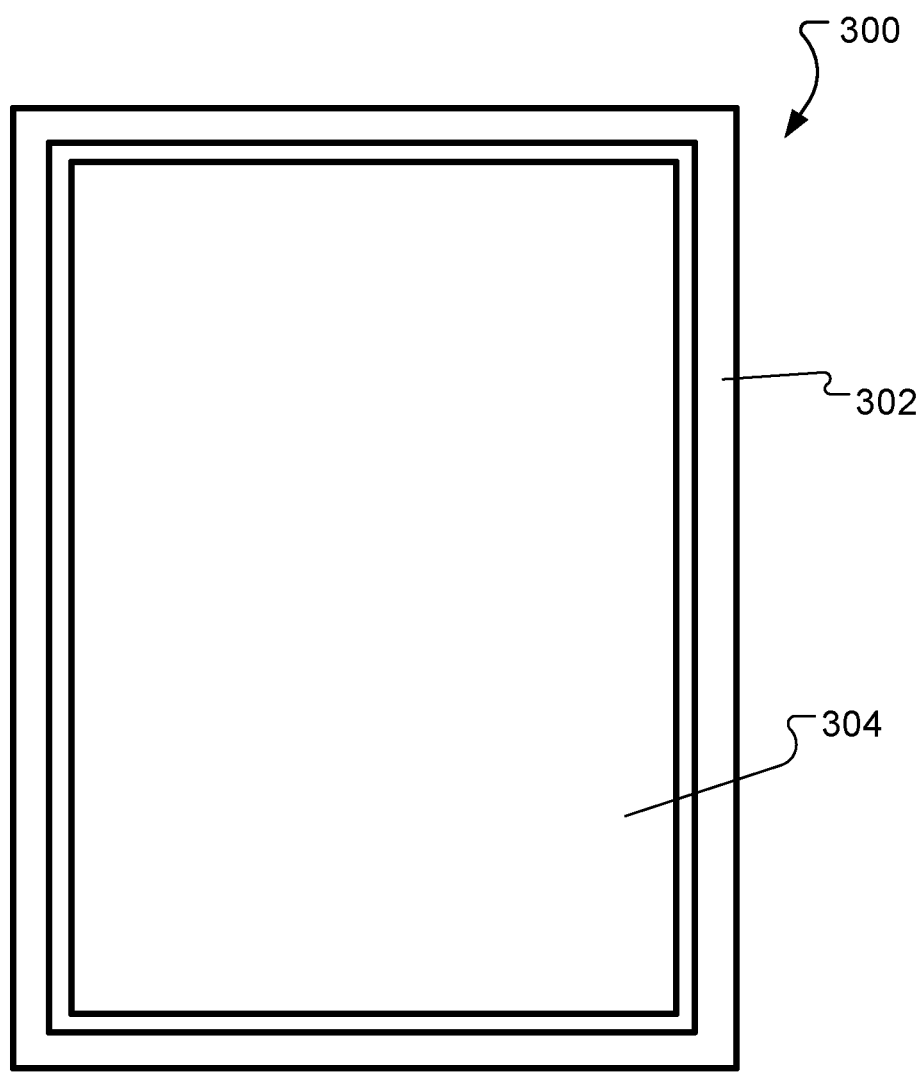
FIGS. 3A-3C are illustrations of a window.
Figure 3B:
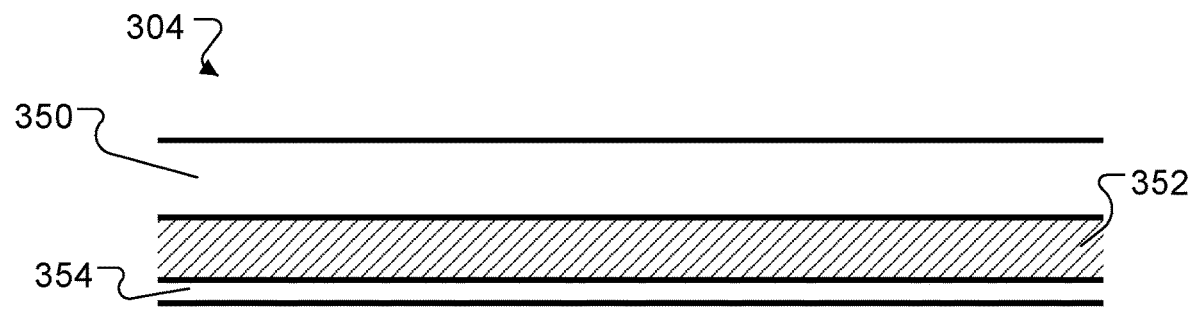
Figure 3C:
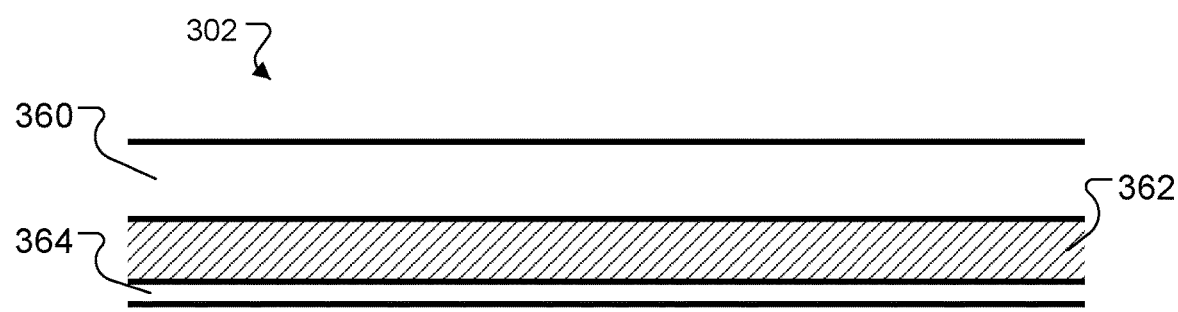

FIGS. 3A-3C illustrate a window 300 including an NPR material. The window 300 includes a frame 302, and a window pane 304 disposed within an interior space defined by the frame 302. The frame 302, the window pane 304, or both exhibit a negative Poisson's ratio, e.g., the frame 302, the window pane 304, or both can be formed at least in part of an NPR material or an NPR-PPR composite material, e.g., an NPR foam material. The frame 302 can be wood, polymer, metal, ceramic, or another suitable material. For instance, when the frame 302 exhibits a negative Poisson's ratio, the frame 302 can include an NPR foam material, such as an NPR polymer foam, NPR metal foam, or NPR ceramic foam. The window pane 304 can be a glass, a glass-ceramic, a polymer glass (e.g., a glass composed of polymethylmethacrylate (PMMA), polystyrene, polycarbonate, etc.), a polymer, or another suitable material. For instance, when the window pane 304 exhibits a negative Poisson's ratio, the window pane 304 can include an NPR foam material, such as an NPR glass foam, NPR polymer glass foam, NPR glass-ceramic foam, or NPR polymer foam. In some examples, the window pane 304 is transparent to visible light, e.g., allowing transmission of at least 75% of visible light, at least 80%, at least 85%, at least 90%, at least 95%, at least 98%, at least 99%, or at least 99.5%. In some examples, the window pane 904 is a filter designed to block transmission of certain wavelengths, e.g., certain wavelengths of visible light, ultraviolet light, or infrared light. For instance, as discussed further below, in some examples, the window can be a filter designed to block certain wavelengths of radiation.

Referring to FIG. 3B, the window pane 304 is a layered NPR-PPR composite that includes multiple layers 350, 352, 354. In some embodiments, the window pane 304 can include more or fewer than three layers (e.g., one layer, two layers, four layers, etc.). The middle layer 352 is composed of a different material than the outer layers 350, 354. In an example, the middle layer 352 of the window pane 304 is or includes an NPR material, while the outer layers 350, 354 of the window pane 304 are a PPR material. The thicknesses of the layer 350, 352, 354 can be selected based on the wavelengths to be transmitted through or blocked by the window pane 304.

The NPR material used for the window pane 304 can be an NPR foam, such as an NPR polymer foam, such as a foam of polymethylmethacrylate (PMMA), polystyrene, polycarbonate, or other suitable polymers. The NPR foam material used for the window pane can be an NPR polymer foam, such as an NPR thermoplastic polymer foam (e.g., polyester polyurethane or polyether polyurethane) or an NPR viscoelastic elastomer foam. In some examples, components of the window pane are formed of an NPR composite material that includes both an NPR material (e.g., an NPR foam material) and a PPR material, e.g., alternating layers of NPR material and PPR material, or a matrix of PPR material with NPR material embedded therein, or a matrix of NPR material with PPR material embedded therein.

In a specific example, the middle layer 352 of the window pane 304 is formed of an NPR material or an NPR-PPR composite material, and the outer layers 350, 354 are formed of a PPR material and cover the middle layer 352 such that the NPR material of the middle layer is not exposed to the environment. This configuration can provide some of the benefits of an NPR material while also achieving benefits, such as durability, water resistance, or hardness, provided by the PPR material covering. In some examples, the middle layer 354 of the window pane 304 is a PPR material and the outer layers 350, 354 are an NPR material or an NPR-PPR composite material.

The presence of NPR material in the window pane can contribute to target performance characteristics, such as acoustic insulation, mechanical insulation, or light insulation, or combinations thereof. For example, NPR materials in the window pane can attenuate sound waves which impinge on the window pane, preventing the sound waves from traveling through the window pane and thereby helping to protect a user from loud noises. The NPR materials in the window pane can absorb energy from impacts (e.g., wind, hail, etc.) incident on the window pane. The NPR materials in the window panel can absorb or reflect light impinging on the window panel, e.g., absorbing or reflecting undesirable wavelengths (such as ultraviolet wavelengths) to act as a filter prevent transmission of radiation in a target range of wavelengths. Generally, NPR materials have a lower density than PPR materials, e.g., than PPR materials of a similar composition or than PPR materials having similar mechanical properties, and window panes including NPR materials can thus be lighter in weight and use less material than similar window panes formed of PPR materials.

Figure 8:
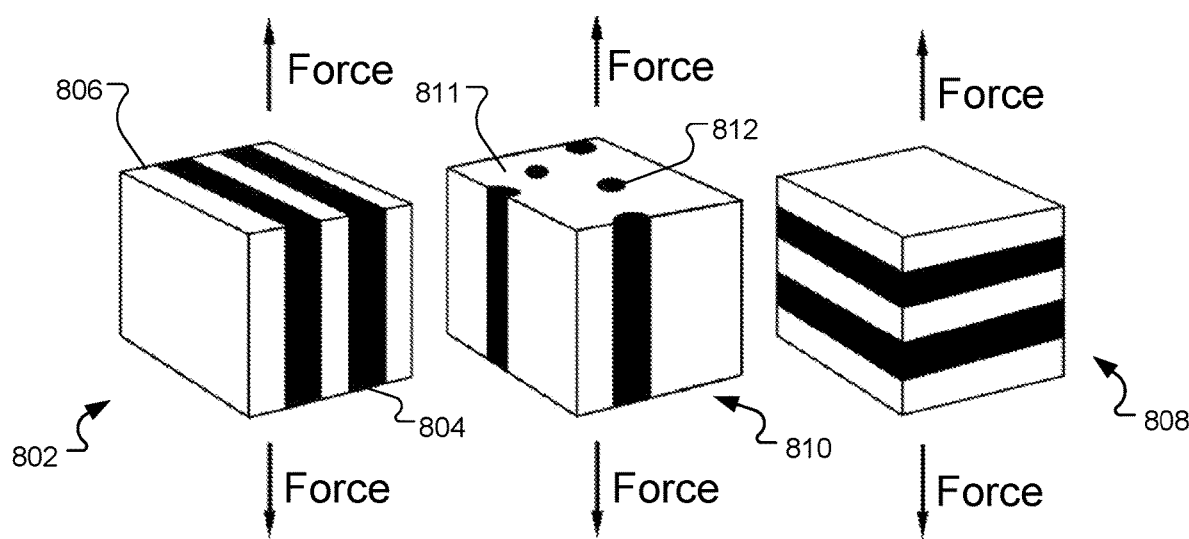
FIG. 8 is an illustration of composite materials.

Referring to FIG. 3C, the window frame 302 is an NPR-PPR composite that includes multiple layers 360, 362, 364. In some embodiments, the window frame 302 can include more or fewer than three layers (e.g., one layer, two layers, four layers, many more than four layers, etc.). The middle layer 362 is composed of a different material than the outer layers 360, 364. In an example, the middle layer 362 of the window frame 302 is or includes an NPR material, while the outer layers 360, 364 of the window frame 302 are a PPR material. In some examples, the window frame 302 is an NPR-PPR composite that includes a matrix of PPR material within which are disposed inclusions of NPR material. In some examples, the window frame 302 is an NPR-PPR composite having a structure such as illustrated in FIG. 8, infra.

The NPR material used for the window frame 302 can be an NPR foam, such as an NPR polymer foam (e.g., a foam of polymethylmethacrylate (PMMA), polystyrene, polycarbonate, or other suitable polymers), an NPR ceramic foam, or an NPR metal foam. The NPR foam material used for the window frame can be an NPR polymer foam, such as an NPR thermoplastic polymer foam (e.g., polyester polyurethane or polyether polyurethane) or an NPR viscoelastic elastomer foam. In some examples, components of the window frame are formed of an NPR composite material that includes both an NPR material (e.g., an NPR foam material) and a PPR material, e.g., alternating layers of NPR material and PPR material, or a matrix of PPR material with NPR material embedded therein, or a matrix of NPR material with PPR material embedded therein.

In a specific example, the middle layer 362 of the window frame 302 is formed of an NPR material or an NPR-PPR composite material (e.g., a layered composite or a matrix composite such as a matrix of PPR material with NPR material inclusions or a matrix of NPR material with PPR material inclusions) and the outer layers 360, 364 are formed of a PPR material and cover the middle layer 362 such that the NPR material of the middle layer is not exposed to the environment. This configuration can provide some of the benefits of an NPR material while also achieving benefits, such as durability, water resistance, or hardness, provided by the PPR material covering. In some examples, the middle layer 364 of the window frame 302 is a PPR material and the outer layers 360, 364 are an NPR material or an NPR-PPR composite material.

The presence of NPR material in the window frame can contribute to target performance characteristics. For instance, a window frame including NPR material can absorb energy efficiently, thereby exhibiting greater tensile strength, flexibility, impact resistance, and durability than a comparable window frame including only positive Poisson's ratio materials. A window frame including NPR material provides structural integrity, holding the window pane in place even in the face of, e.g., impact or vibration. Furthermore, NPR materials are porous and thus less dense and lighter weight than comparable PPR materials.

NPR materials can be used to absorb, attenuate, reflect, or otherwise prevent transmission of energy, such as magnetic fields or electromagnetic waves.

Figure 4A:
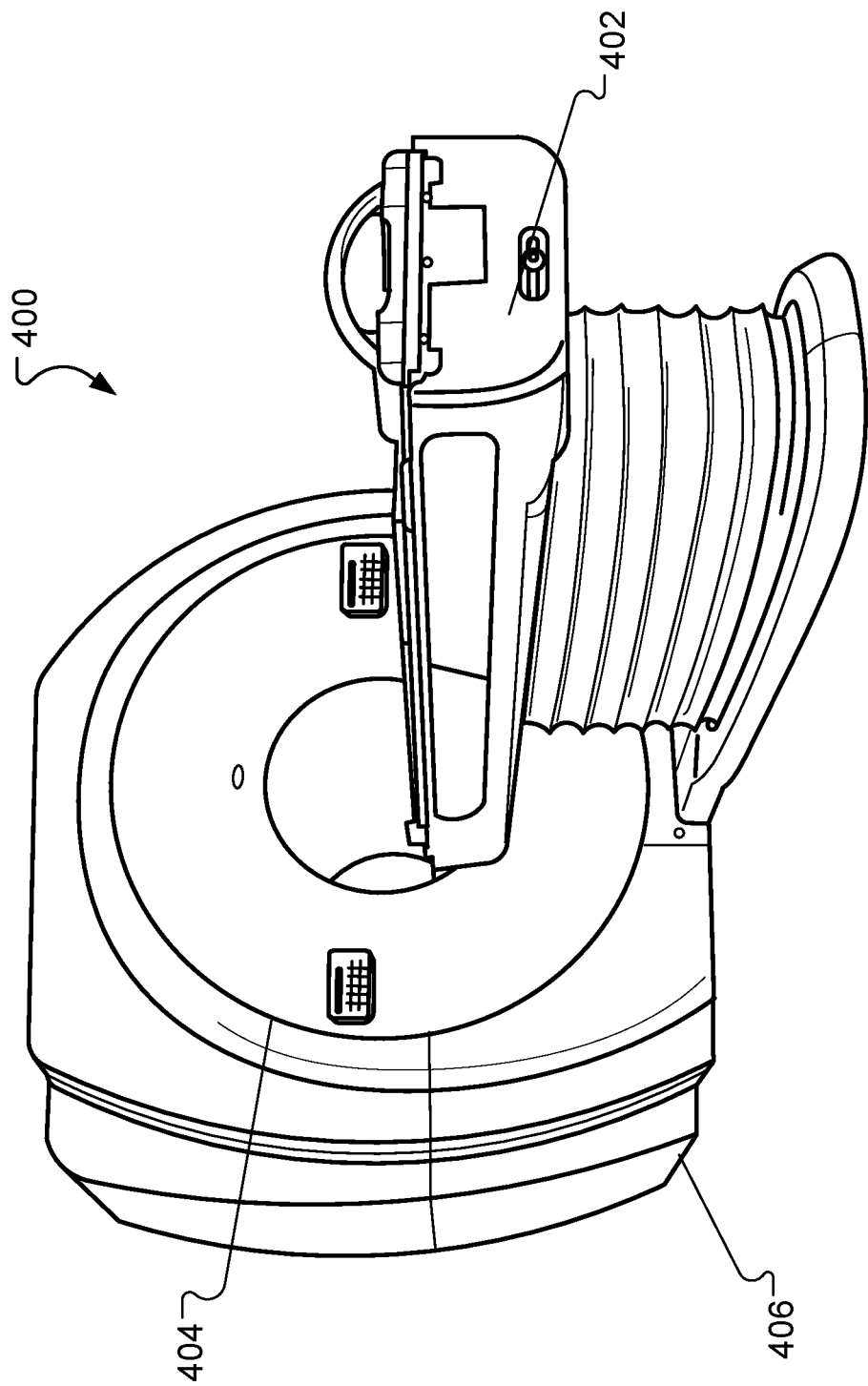
FIGS. 4A-4C are illustrations of an MRI machine.
Figure 4B:
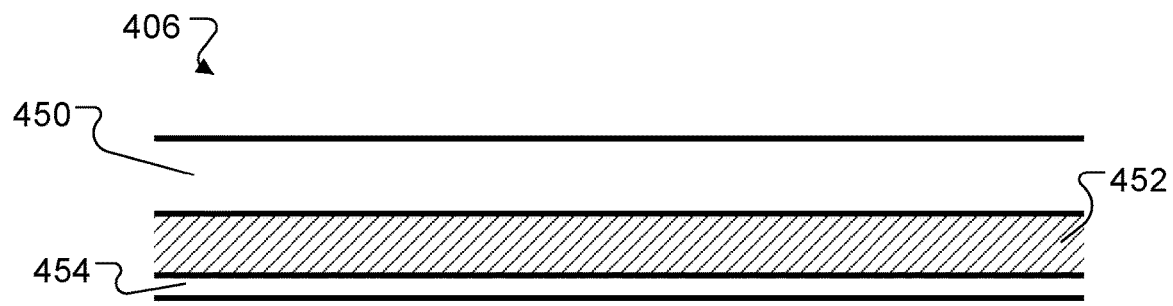

FIGS. 4A and 4B illustrate a magnetic resonance imaging (MRI) machine 400. The MRI machine 400 includes a bed 402 for a patient to lay in, and a scanner 404 which conducts the magnetic resonance imaging. A housing 406 of the scanner 404 is a generally cylindrical structure defining a cylindrical bore within which the bed is disposed. A magnetic field generation system including a magnet (e.g., an electromagnet), one or more detection coils, and other elements of an MM system, is disposed in an interior of the housing. The magnetic field generation system is controlled by a computer (not shown). The housing 406 (e.g., an external surface of the housing) includes an NPR material (e.g., an NPR material or an NPR-PPR composite material) to shield (e.g., redirect) the magnetic field emitted from the MM.

MRI is a medical imaging technique used, e.g., in radiology and nuclear medicine in order to investigate the anatomy and physiology of the body, and to detect pathologies including tumors, inflammation, neurological conditions such as stroke, disorders of muscles and joints, and abnormalities in the heart and blood vessels, among others. Certain atomic nuclei are able to absorb and emit radio frequency energy when placed in an external magnetic field. In clinical and research MRI, hydrogen atoms are often used to generate a detectable radio-frequency signal that is received by antennas in close proximity to the anatomy being examined. Hydrogen atoms are naturally abundant in people and other biological organisms, particularly in water and fat. For this reason, most MRI scans essentially map the location of water and fat in the body. Pulses of radio waves excite the nuclear spin energy transition, and magnetic field gradients localize the signal in space. By varying the parameters of the pulse sequence, different contrasts may be generated between tissues based on the relaxation properties of the hydrogen atoms therein.

The housing 406 of the MRI scanner 404 is formed at least in part of an NPR material or an NPR-PPR composite material. For instance, the housing can be composed of an NPR foam material, e.g., an NPR metal foam, an NPR polymer foam, or an NPR ceramic foam. In some examples, some regions of the housing 406 of the MM scanner 404 are formed of an NPR material or an NPR-PPR composite material and other portions are formed of a PPR material. In some examples, the NPR foam material of the housing 406 is an NPR metal foam, such as a foam of iron, nickel, cobalt, or another magnetic material. In some examples, components of the housing are formed of an NPR composite material that includes both an NPR material (e.g., an NPR foam material) and a PPR material. In some examples, the NPR material or NPR-PPR composite material is a layer disposed on an external- or internal-facing surface of the housing 406.

In the example of FIGS. 4A-4B, the housing 406 of the MRI scanner includes three layers 450, 452, 454. In some embodiments, the housing can be composed of more or fewer than three layers (e.g., one layer, two layers, four layers, etc.). The middle layer 452 is composed of a different material than the outer layers 450, 454. In an example, the middle layer 452 of the housing 406 of the MM scanner 404 is or includes an NPR material, while the outer layers 450, 454 are a PPR material, e.g., iron, nickel, cobalt, or another suitable PPR material.

In a specific example, the middle layer 452 of the housing 406 of the MRI scanner 404 is formed of an NPR material or an NPR-PPR composite material, and the outer layers 450, 454 are formed of a PPR material and cover the middle layer 452 such that the NPR material of the middle layer 452 is not exposed to the environment. This configuration can provide some of the benefits of an NPR material while also achieving benefits, such as durability or hardness, provided by the PPR material covering. In some examples, the middle layer 452 of the housing 406 of the MM scanner 404 is a PPR material and the outer layers 450, 454 are an NPR material or an NPR-PPR composite material.

The presence of NPR material in the housing 406 of the MRI scanner 404 can contribute to target performance characteristics, such as magnetic insulation. For example, NPR metal materials in the housing can redirect the magnetic field generated by the MRI scanner 404 so that the magnetic forces emitted by the MRI do not reach the surrounding environment. An NPR metal material in the housing 406 provides a path for the magnetic field to follow, and reduces the magnetic field that emanates outside of the exterior surface. Additionally, NPR materials have a lower density than PPR materials, e.g., than PPR materials of a similar composition or than PPR materials having similar mechanical properties, and MRI scanners including NPR materials can thus be lighter in weight and use less material than similar objects formed of PPR materials.

Figure 4C:
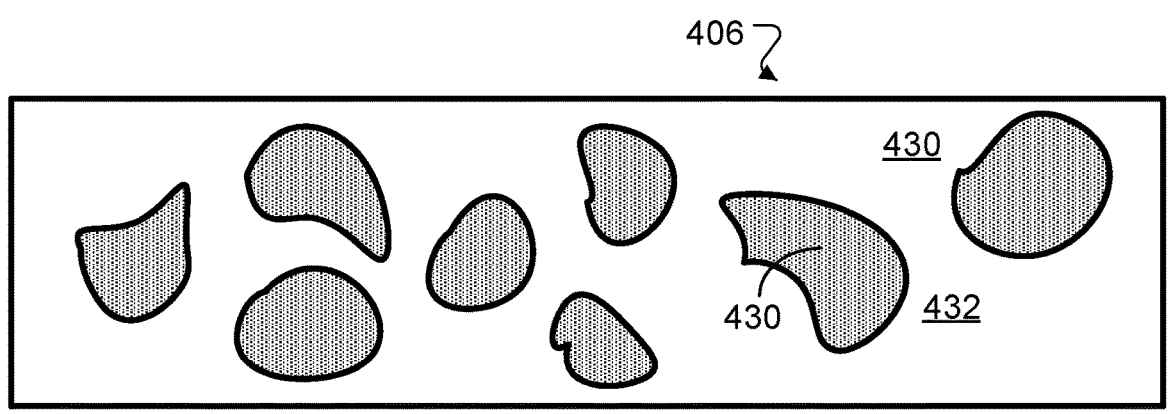

In some examples, the NPR materials in the housing 406 are arranged to define a pathway for the magnetic field. For instance, referring to FIG. 4C, the housing 406 of the MM scanner includes first regions 430 of NPR material and second regions 432 of PPR material that together define a pathway for redirection of the magnetic field. The first regions and second regions can each be continuous phases, or the first regions of NPR material 426 can be dispersed in a matrix of the PPR material 432 (as illustrated), or vice versa.

NPR materials can be used in the housing of other types of diagnostic or therapeutic medical devices beyond MRI machines to absorb, attenuate, reflect, or otherwise prevent transmission of energy (e.g., magnetic fields or electromagnetic fields) generated by the medical devices into the environment surrounding the medical devices. For instance, NPR materials can be used in the housing of X-ray machines, computerized tomography (CT) scanners, or radiation-based sterilization devices. NPR materials can also be used in the housing of other devices that generate radiation, such as laser pointers, microwave ovens, power tools, tanning beds, or other radiation-generating devices.

The characteristics of the NPR material can be selected based on the characteristics (e.g., wavelength, intensity) of the radiation generated by the device the housing of which incorporates the NPR material. For instance, when an NPR-PPR composite is used in the housing, the relative sizes of the NPR and PPR portions of the composite (e.g., the number and thickness of the layers for a layered composite, the size or number density of the inclusions for a matrix composite, the volume or weight percentage of NPR versus PPR materials in the composite, the composition of the NPR and PPR materials) can be selected to absorb, attenuate, or reflect radiation in a target range of wavelengths.

The NPR foam materials described here can be an NPR polymer foam, such as a foam of polytetrafluoroethylene (PTFE), expanded polytetrafluoroethylene (ePTFE), or other suitable polymers. The NPR foam material used for can be an NPR polymer foam, such as an NPR thermoplastic polymer foam (e.g., a foam of polyester polyurethane or polyether polyurethane); an NPR viscoelastic elastomer foam; an NPR rubber foam (e.g., a foam of butadiene, polybutadiene, styrene-butadiene, or another suitable rubber); or another polymer foam. In some examples, the NPR material is an NPR composite material that includes both an NPR material (e.g., an NPR foam material) and a PPR material. NPR-PPR composite materials are discussed further below. A foam is a multi-phase composite material in which one phase is gaseous and the one or more other phases are solid (e.g., polymeric, ceramic, or metal). Foams can be closed-cell foams, in which each gaseous cell is sealed by solid material; open-cell foams, in which the each cell communicates with the outside atmosphere; or mixed, in which some cells are closed and some cells are open.

Figure 5:
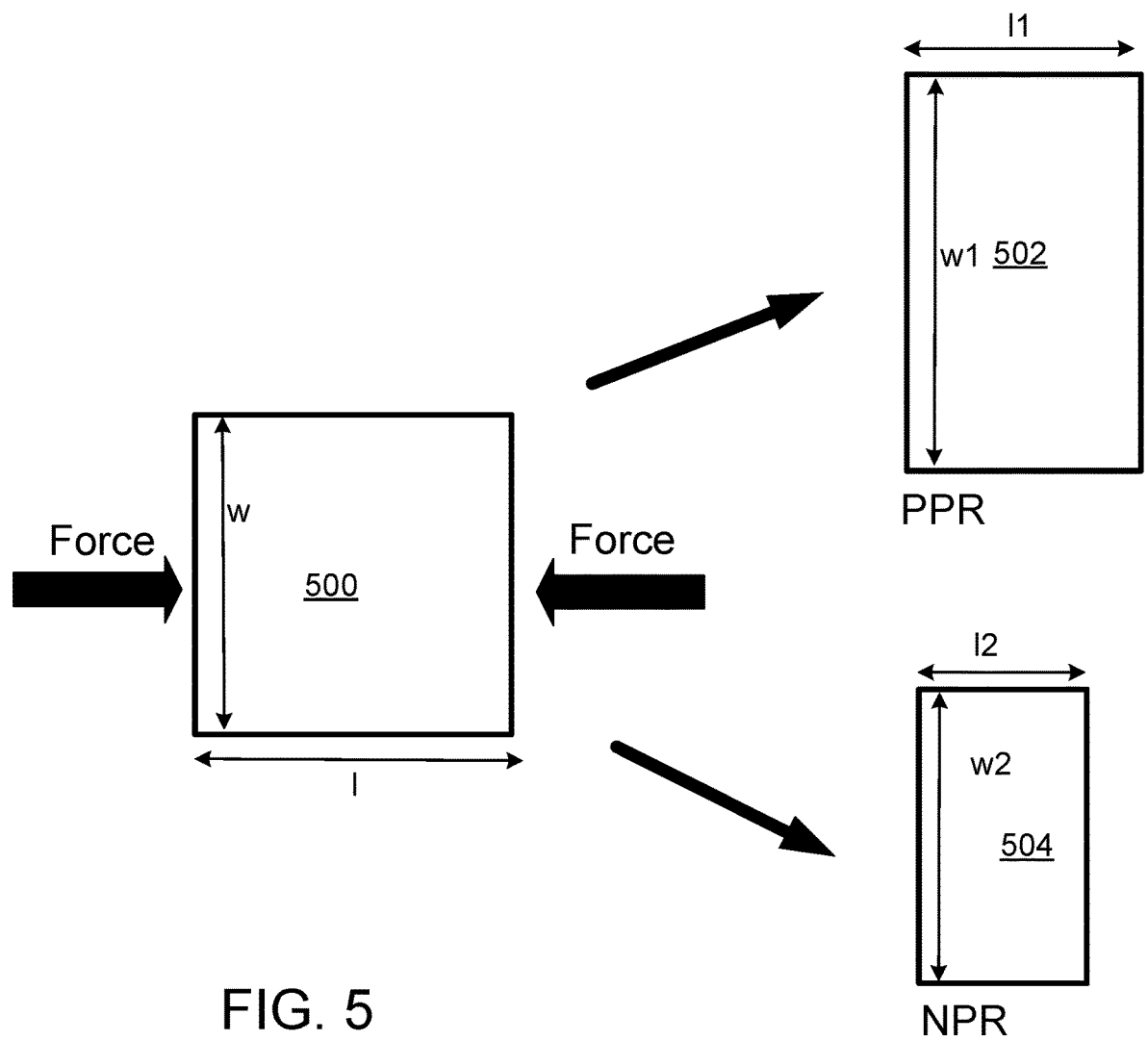
FIG. 5 is an illustration of materials with negative and positive Poisson's ratios.

Materials with negative and positive Poisson's ratios are illustrated in FIG. 5, which depicts a hypothetical two-dimensional block of material 500 with length l and width w.

If the hypothetical block of material 500 is a PPR material, when the block of material 500 is compressed along its width w, the material deforms into the shape shown as block 502. The width w1 of block 502 is less than the width w of block 500, and the length l1 of block 502 is greater than the length l of block 500: the material compresses along its width and expands along its length.

By contrast, if the hypothetical block of material 500 is an NPR material, when the block of material 500 is compressed along its width w, the material deforms into the shape shown as block 504. Both the width w2 and the length l2 of block 504 are less than the width w and length l, respectively, of block 500: the material compresses along both its width and its length.

NPR materials for insulators can be foams, such as polymeric foams, ceramic foams, metal foams, or combinations thereof. A foam is a multi-phase composite material in which one phase is gaseous and the one or more other phases are solid (e.g., polymeric, ceramic, or metal). Foams can be closed-cell foams, in which each gaseous cell is sealed by solid material; open-cell foams, in which the each cell communicates with the outside atmosphere; or mixed, in which some cells are closed and some cells are open.

An NPR foam can be polydisperse (e.g., the cells of the foam are not all of the same size) and disordered (e.g., the cells of the foam are randomly arranged, as opposed to being arranged in a regular lattice). An NPR foam can be a cellular structure having a characteristic dimension (e.g., the size of a representative cell, such as the width of the cell from one wall to the opposing wall) ranging from 0.1 µm to about 3 mm, e.g., about 0.1 µm, about 0.5 µm, about 1 µm, about 10 µm, about 50 µm, about 100 µm, about 500 µm, about 1 mm, about 2 mm, or about 3 mm.

In some examples, NPR foams are produced by transformation of PPR foams to change the structure of the foam into a structure that exhibits a negative Poisson's ratio. In some examples, NPR foams are produced by transformation of nanostructured or microstructured PPR materials, such as nanospheres, microspheres, nanotubes, microtubes, or other nano- or microstructured materials, into a foam structure that exhibits a negative Poisson's ratio. The transformation of a PPR foam or a nanostructured or microstructured material into an NPR foam can involve thermal treatment (e.g., heating, cooling, or both), application of pressure, or a combination thereof. In some examples, PPR materials, such as PPR foams or nanostructured or microstructured PPR materials, are transformed into NPR materials by chemical processes, e.g., by using glue. In some examples, NPR materials are fabricated using micromachining or lithographic techniques, e.g., by laser micromachining or lithographic patterning of thin layers of material. In some examples, NPR materials are fabricated by additive manufacturing (e.g., three-dimensional (3D) printing) techniques, such as stereolithography, selective laser sintering, or other appropriate additive manufacturing technique.

In an example, a PPR thermoplastic foam, such as an elastomeric silicone film, can be transformed into an NPR foam by compressing the PPR foam, heating the compressed foam to a temperature above its softening point, and cooling the compressed foam. In an example, a PPR foam composed of a ductile metal can be transformed into an NPR foam by uniaxially compressing the PPR foam until the foam yields, followed by uniaxially compression in other directions.

In some examples, NPR foams are produced by transformation of PPR foams to change the structure of the foam into a structure that exhibits a negative Poisson's ratio. In some examples, NPR foams are produced by transformation of nanostructured or microstructured PPR materials, such as nanospheres, microspheres, nanotubes, microtubes, or other nano- or microstructured materials, into a foam structure that exhibits a negative Poisson's ratio. The transformation of a PPR foam or a nanostructured or microstructured material into an NPR foam can involve thermal treatment (e.g., heating, cooling, or both), application of pressure, or a combination thereof. In some examples, PPR materials, such as PPR foams or nanostructured or microstructured PPR materials, are transformed into NPR materials by chemical processes, e.g., by using glue. In some examples, NPR materials are fabricated using micromachining or lithographic techniques, e.g., by laser micromachining or lithographic patterning of thin layers of material. In some examples, NPR materials are fabricated by additive manufacturing (e.g., three-dimensional (3D) printing) techniques, such as stereolithography, selective laser sintering, or other appropriate additive manufacturing technique.

In an example, a PPR thermoplastic foam, such as an elastomeric silicone film, can be transformed into an NPR foam by compressing the PPR foam, heating the compressed foam to a temperature above its softening point, and cooling the compressed foam. In an example, a PPR foam composed of a ductile metal can be transformed into an NPR foam by uniaxially compressing the PPR foam until the foam yields, followed by uniaxially compression in other directions.

NPR-PPR composite materials are composites that include both regions of NPR material and regions of PPR material. NPR-PPR composite materials can be laminar composites, matrix composites (e.g., metal matrix composites, polymer matrix composites, or ceramic matrix composites), particulate reinforced composites, fiber reinforced composites, or other types of composite materials. In some examples, the NPR material is the matrix phase of the composite and the PPR material is the reinforcement phase, e.g., the particulate phase or fiber phase. In some examples, the PPR material is the matrix phase of the composite and the NPR material is the reinforcement phase.

NPR materials can exhibit various desirable properties, including high shear modulus, effective energy absorption, and high toughness (e.g., high resistance to indentation, high fracture toughness), among others. The properties of NPR materials are such that an item that includes an NPR material undergoes a different (e.g., smaller) change in dimension when absorbing energy than a comparable item formed of only PPR material.

Figure 6:
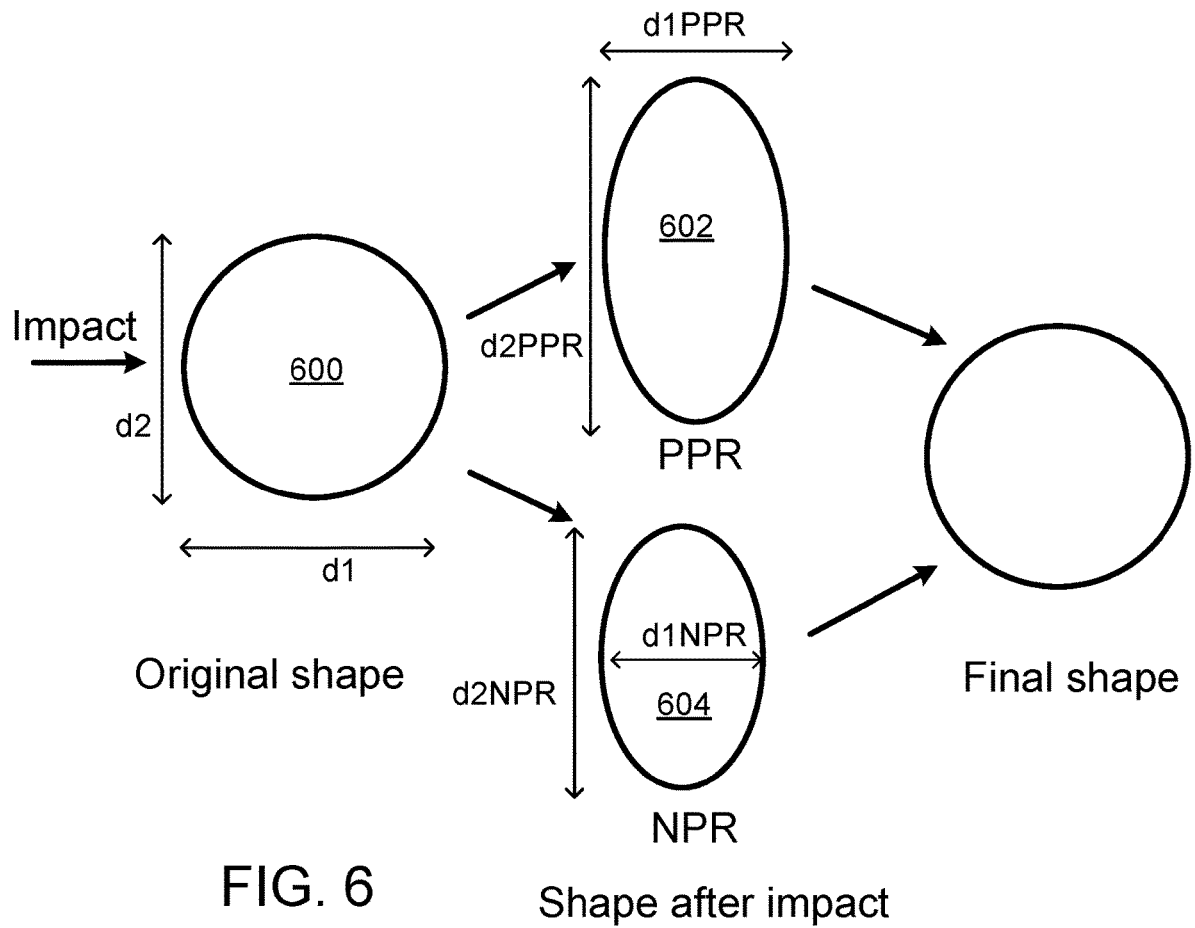
FIG. 6 is an illustration of balls with negative and positive Poisson's ratios.

FIG. 6 shows a schematic depiction of the change in diameter of a material 600 upon impact. Although the material 600 in FIG. 6 is shown as a rounded ball, a similar deformation occurs in materials of other shapes. Prior to impact, the material 600 has a diameter d1 in the direction of the impact and a diameter d2 in the direction perpendicular to the impact. If the material 600 is a PPR material, the material undergoes significant deformation (e.g., elastic deformation) into a shape 602, such that the diameter in the direction of the impact decreases to d1PPR and the diameter in the direction perpendicular to the impact increases to d2PPR. By contrast, if the material 600 is an NPR material, the material undergoes less extensive deformation into a shape 604. The diameter of the shape 604 in the direction of the impact decreases to d1NPR, which is approximately the same as d1PPR. However, the diameter of the shape 604 in the direction perpendicular to the impact also decrease, to d2NPR. The magnitude of the difference between d2 and d2NPR is less than the magnitude of the difference between d2 and d2PPR, meaning that the NPR material undergoes less deformation than the PPR ball.

Figure 7A:
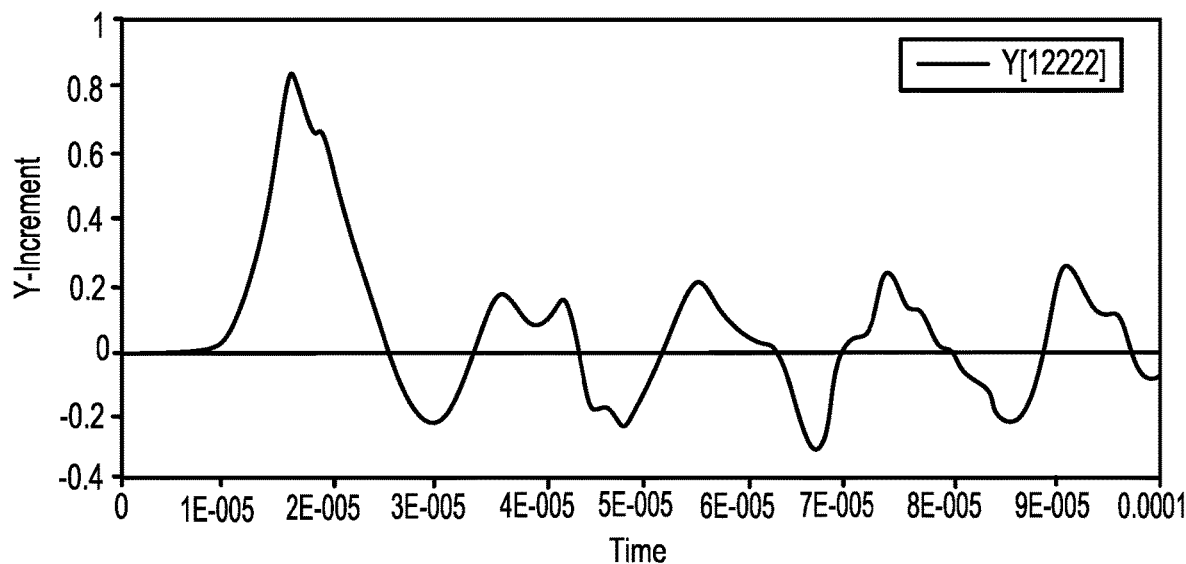
FIGS. 7A and 7B are plots of diameter versus time.
Figure 7B:
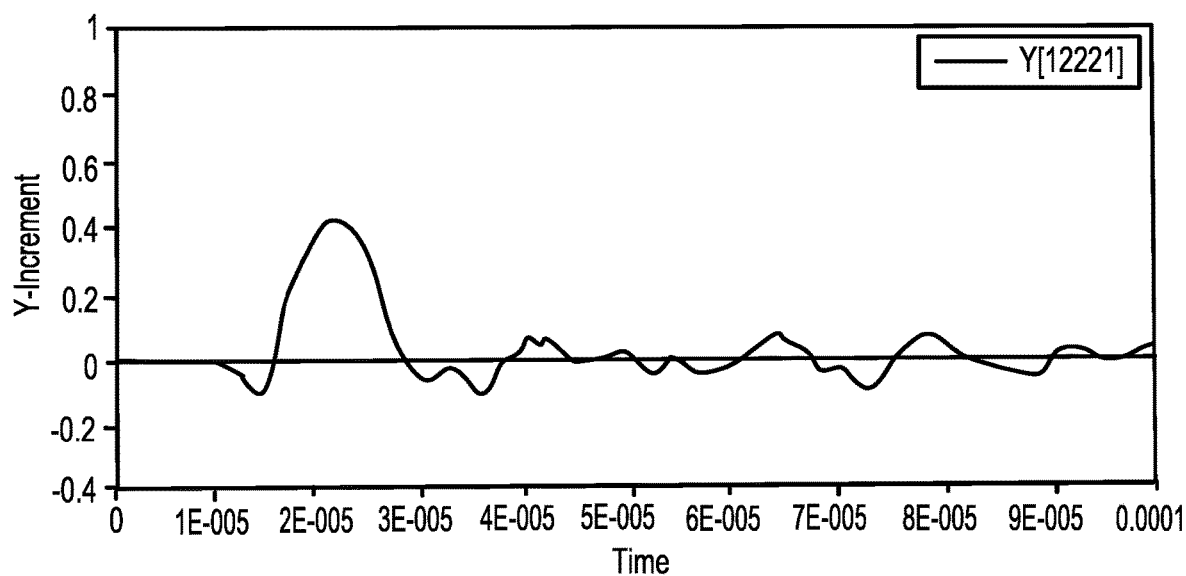

FIGS. 7A and 7B show plots of diameter versus time for a substantially spherical PPR material with a Poisson's ratio of 0.45 and an NPR material with a Poisson's ratio of –0.45, respectively, responsive to being struck with an equivalent force. In this example, the NPR material undergoes a smaller initial change in diameter than does the PPR material, and the oscillations in diameter are smaller in magnitude and dampen more quickly. Again, although FIGS. 7A and 7B are specific to substantially spherical materials, a similar behavior occurs in NPR and PPR materials of other shapes. The material of an insulator can be selected to balance rigidity and elasticity.

FIG. 8 illustrates examples of NPR-PPR composite materials. An NPR-PPR composite material 802 is a laminar composite including alternating layers 804 of NPR material and layers 805 of PPR material. The layers 804, 806 are arranged in parallel to a force to be exerted on the composite material 802. Although the layers 804, 806 are shown as having equal width, in some examples, a laminar composite can have layers of different widths.

An NPR-PPR composite material 808 is a laminar composite including alternating layers of NPR material and PPR material, with the layers arranged perpendicular to a force to be exerted on the material 808. In some examples, the layers of a laminar composite are arranged at an angle to the expected force that is neither perpendicular nor parallel.

An NPR-PPR composite material 812 is a matrix composite including a matrix phase 811 of NPR material with a reinforcement phase 812 of PPR material. In the material 812, the reinforcement phase 812 includes fibers of the PPR material; in some examples, the reinforcement phase 812 can include particles or other configuration. In some examples, NPR-PPR composite materials can have a matrix phase of a PPR material with a reinforcement phase of an NPR material.

FIG. 9 illustrates the mechanical behavior of PPR and NPR/PPR composite materials. A hypothetical block 900 of PPR material, when compressed along its width w, deforms into a shape 902. The width w1 of the compressed block 902 is less than the width w of the uncompressed block 900, and the length l1 of the compressed block 902 is greater than the length l of the uncompressed block: the material compresses along the axis to which the compressive force is applied and expands along a perpendicular axis.

A block 904 of NPR/PPR composite material includes a region 908 of NPR material sandwiched between two regions 906 of PPR material. When the block 904 of composite material is compressed along its width, the material deforms into a shape 910. The PPR regions 906 compress along the axis of compression and expand along a perpendicular axis, e.g., as described above for the block 900 of PPR material, such that, e.g., the width w2 of a region 906 of uncompressed PPR material compresses to a smaller width w4 and the length l2 of the region 906 expands to a greater length l4. In contrast, the NPR region 908 compresses along both the axis of compression and along the perpendicular axis, such that, e.g., both the width w3 and length l3 of the uncompressed NPR region 908 are greater than the width w5 and length l5 of the compressed NPR region 908.

Figure 10:
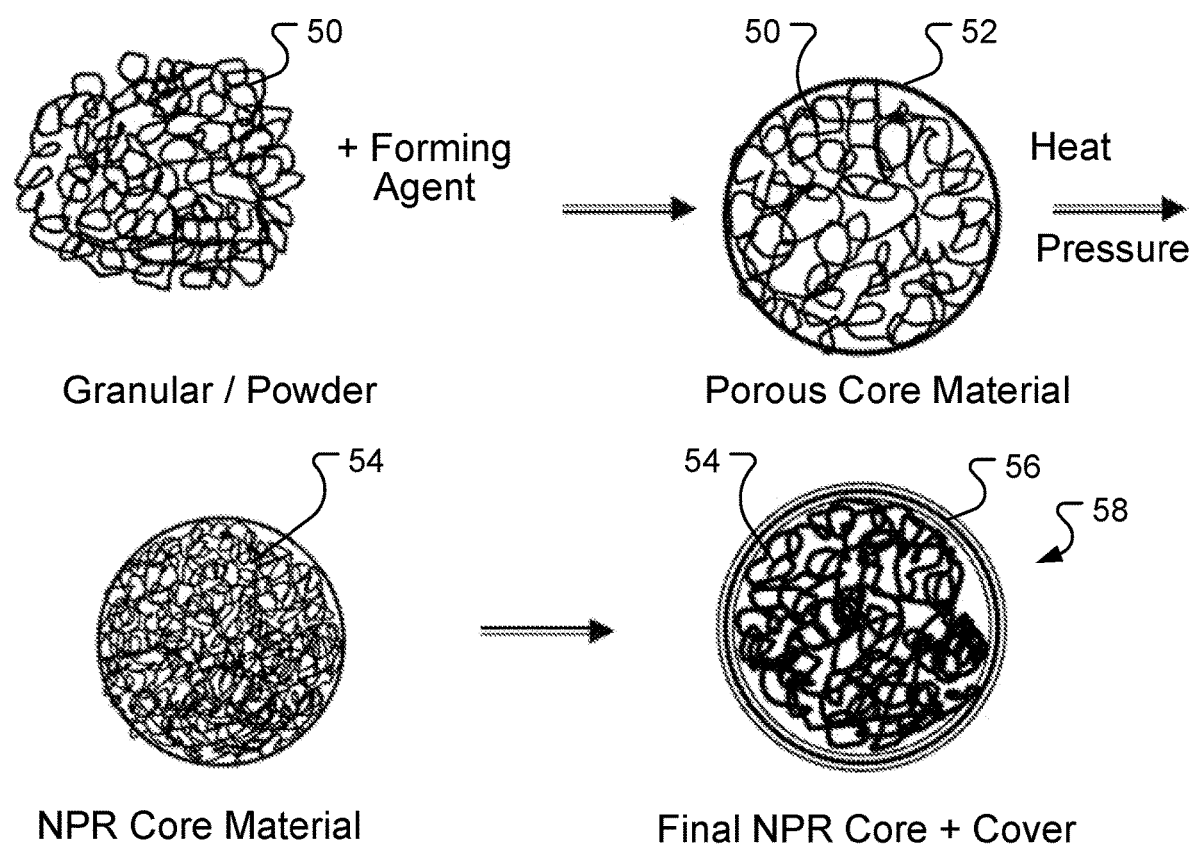
FIG. 10 is an illustration of a method of making an NPR material.

FIG. 10 illustrates an example method of making an object, such as casing, window, or other object, formed of an NPR material. A granular or powdered material, such as a polymer material (e.g., a rubber) is mixed with a foaming agent to form a porous material 50. The porous material 50 is placed into a mold 52. Pressure is applied to compress the material 50 and the compressed material is heated to a temperature above its softening point. The material is then allowed to cool, resulting in an NPR foam 54. The NPR foam 54 is covered with an outer layer 56, such as a polymer layer, and heat and pressure is applied again to cure the final material into an object 58.

In some examples, a material can be formed into an NPR material by forming nanoscale or microscale structures, such as spheres or tubules, with the material.

Other methods can also be used to fabricate an object formed of an NPR material or an NPR-PPR composite material. For example, various additive manufacturing (e.g., 3D printing) techniques, such as stereolithography, selective laser sintering, or other appropriate additive manufacturing technique, can be implemented to fabricate an object formed of an NPR material or an NPR-PPR composite. In some examples, different components of the object are made by different techniques. For example, an inner layer may be 3D printed while the out layer is not, or vice versa. Additive manufacturing techniques can enable seams to be eliminated.

Other embodiments are within the scope of the following claims.

What is claimed is:

1. A corrugated paper comprising:
   first and second sheets of paper; and a layer of structured paper disposed between the first and second sheets of paper, in which the layer of structured paper comprises cells, in which at least some of the cells are negative Poisson's ratio (NPR) cells, each NPR cell comprising:
  top and bottom walls, and
  side walls comprising an NPR material, the side walls angled inwards toward a central portion of the NPR cell, such that application of a compressive force between the top and bottom walls of the NPR cell causes a lateral dimension of the NPR cell between opposite side walls to decrease;
in which the NPR cells exhibit a Poisson's ratio of between 0 and −1.

2. The corrugated paper of claim 1, in which the top, bottom, and side walls of each NPR cell define a hollow interior space at the central portion of the NPR cell.

3. The corrugated paper of claim 1, in which the NPR material includes an NPR foam material.

4. The corrugated paper of claim 1, in which the side walls of each NPR cell define a concave profile.

5. The corrugated paper of claim 1, in which at least some of the cells of the layer of structured paper are positive Poisson's ratio (PPR) cells, each PPR cell comprising:
  top and bottom walls, and
  side walls angled outwards away from a central portion of the PPR cell, such that application of a compressive force between the top and bottom walls of the NPR cell causes a lateral dimension of the PPR cell between opposite side walls to increase.

6. The corrugated paper of claim 5, in which the layer of structured paper comprises NPR cells alternating with PPR cells, and wherein an angled region of the side wall of a particular PPR cell is nested within an angled region of the side wall of an adjacent NPR cell.

7. The corrugated paper of claim 5, in which the side walls of each PPR cell define a convex profile.

* * * * *